United States Patent
Payne

(10) Patent No.: US 10,527,702 B1
(45) Date of Patent: Jan. 7, 2020

(54) NON-CONTACT VOLTAGE TESTER WITH SELF-TEST

(71) Applicant: Southwire Company, LLC, Carrollton, GA (US)

(72) Inventor: John Lawrence Payne, Newnan, GA (US)

(73) Assignee: Southwire Corporation, LLC, Carrollton, GA (US)

( * ) Notice: Subject to any disclaimer, the term of this patent is extended or adjusted under 35 U.S.C. 154(b) by 266 days.

(21) Appl. No.: 15/493,257

(22) Filed: Apr. 21, 2017

Related U.S. Application Data

(60) Provisional application No. 62/326,523, filed on Apr. 22, 2016.

(51) Int. Cl.
*G01R 35/00* (2006.01)
*G01R 31/44* (2006.01)

(52) U.S. Cl.
CPC ............. *G01R 35/00* (2013.01); *G01R 31/44* (2013.01)

(58) Field of Classification Search
CPC ................................. G01R 35/00; G01R 31/44
See application file for complete search history.

(56) References Cited

U.S. PATENT DOCUMENTS

| | | | |
|---|---|---|---|
| 7,733,078 B2 | 6/2010 | Duke | |
| 8,581,609 B2 | 11/2013 | Unmuessig et al. | |
| 2002/0135349 A1* | 9/2002 | Steber | G01R 1/06788 324/72.5 |
| 2012/0098522 A1* | 4/2012 | Allen, Jr. | G01R 19/155 324/111 |
| 2018/0136303 A1* | 5/2018 | Epperson | G01R 1/22 |

* cited by examiner

*Primary Examiner* — Patrick Assouad
*Assistant Examiner* — Feba Pothen
(74) *Attorney, Agent, or Firm* — Merchant & Gould P.C.

(57) ABSTRACT

A method of conducting a self-test on a non-contact voltage detector with self-test function is disclosed. The method includes receiving at a circuit a signal to power-on the non-contact voltage detector; testing the integrity of a probe by injecting a signal into the probe and checking for receipt of the signal at an input of a circuit; testing the integrity and functioning of the operating LED; testing the integrity and functioning of a voltage indicator LED; and lighting an operating LED only when the probe passes its integrity test and the voltage indicator LED passes its integrity test, otherwise powering down the non-contact voltage detector.

20 Claims, 2 Drawing Sheets

NON-CONTACT VOLTAGE TESTER WITH SELF-TEST

RELATED APPLICATION

Under provisions of 35 U.S.C. § 119(e), Applicant claims the benefit of U.S. Provisional Application No. 62/326,523, filed Apr. 22, 2016, which is incorporated herein by reference in its entirety.

BACKGROUND

Electrical workers often have to work on electrical lines, and they need to ensure that the line is not hot or live. Thus, it becomes prudent and necessary to test whether a line is hot before work commences. An electrical worker will use a non-contact voltage ("NCV") detector to test whether the line is hot. These non-contact voltage detectors are useful because touching the line is not necessary in order to tell the voltage status of the line. However, non-contact voltage detectors can suffer from failures that may yield dangerous false negative results. For example, non-contact voltage detectors may have weak batteries, shorted or open LED indicators, faulty buzzers, or broken wiring at the probe. Conventional non-contact voltage detectors fail to detect many of these fault conditions, resulting in potentially unsafe working conditions for electrical workers.

BRIEF DESCRIPTION OF THE FIGURES

The accompanying drawings, which are incorporated in and constitute a part of this disclosure, illustrate various embodiments of the present disclosure. In the drawings.

DETAILED DESCRIPTION

Overview

Figure 1:
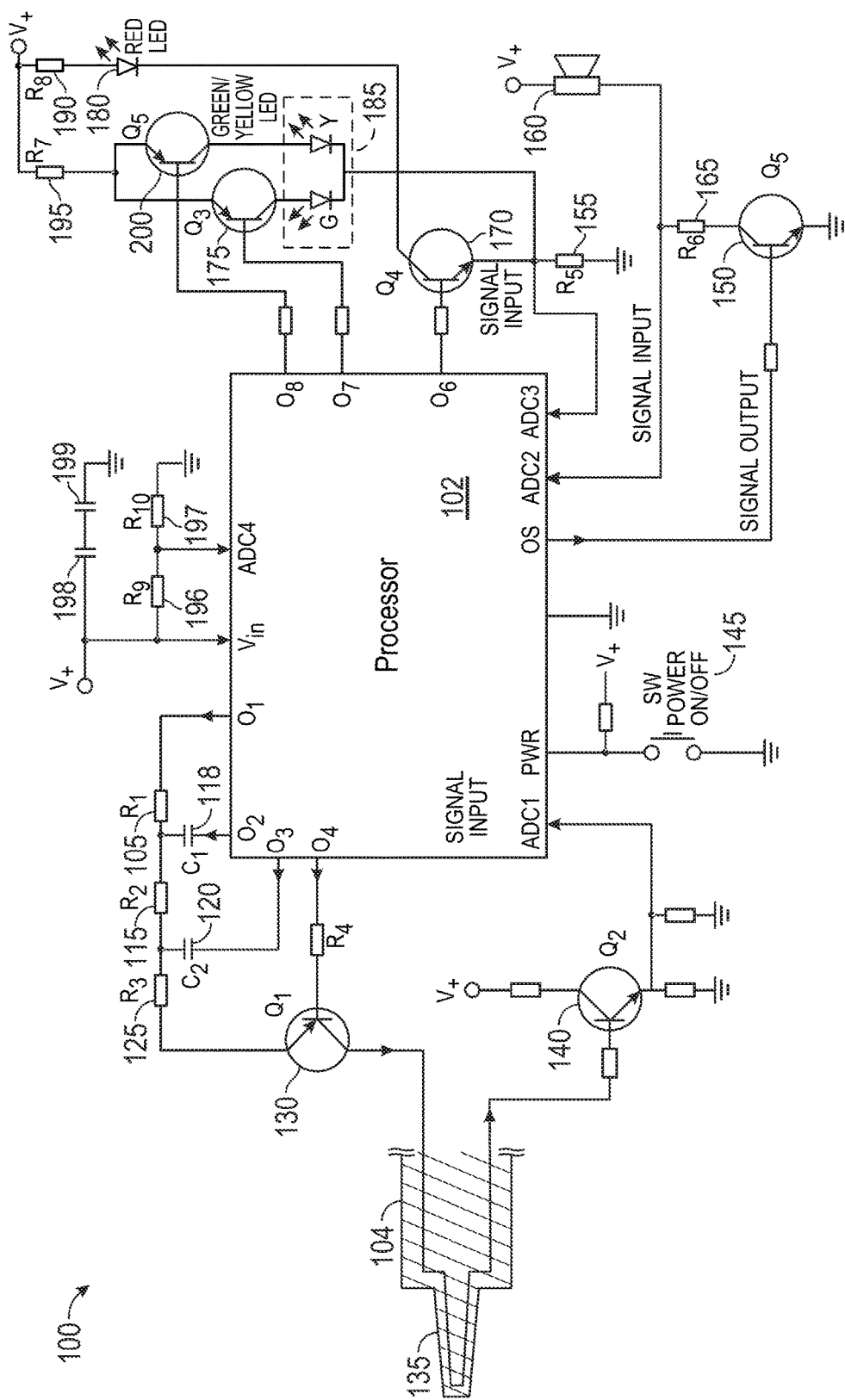
FIG. 1 illustrates an embodiment of an NCV detector 100.

A non-contact voltage detector with self-test features is disclosed. The NCV detector may operate in one of two voltage ranges, for example, 12-48 V or 50-1000 V. The NCV detector may have a plurality of self-test features to check the integrity of a number of features of the NCV detector. These self-test features may be enabled by the processor that performs the voltage detection, in addition to a number of external active and passive components. Self-test features may include testing whether a short or open circuit is present at one or both of a pair of indicator LED's indicating whether the NCV detector is fully operational or if the tested line has voltage present. Such features may also include checking for a short or open circuit on a buzzer that indicates the presence of voltage at the probe, as well as checking for the status of the voltage at the battery or batteries of the NCV detector. Another self-test feature may be the ability to check the integrity of a probe of the NCV detector to ensure that the probe does not have an open circuit. In order to perform this check, one of two signal levels may be injected into the probe to simulate voltage being detected at the probe.

These self-test features may be performed at start-up of the NCV detector or continuously during NCV detector operation. In an exemplary embodiment, operation of the NCV detector is disabled should any of the self-test features fail. For example, if the buzzer, the battery, the probe test or the LED tests fail, the NCV detector would power down and not be operational. In this exemplary embodiment an LED that would indicate normal operation by being, for example, green or yellow would not illuminate unless the NCV detector passes all of its tests.

Both the foregoing overview and the following example embodiment are examples and explanatory only, and should not be considered to restrict the disclosure's scope, as described and claimed. Further, features and/or variations may be provided in addition to those set forth herein. For example, embodiments of the disclosure may be directed to various feature combinations and sub-combinations described in the example embodiment.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

FIG. 1 illustrates an embodiment of an NCV detector. In this discussion, we will initially discuss the operation of the various circuitry, followed by a discussion of the operation sequence of the circuitry during power-up of the NCV detector 100. A processor 102 may trigger and generate signals for the self-test functions, receive the results, and receive the input from any detected voltage. Processor 102 may be, for example, a microprocessor, microcontroller, or digital signal processor. Those skilled in the art after reading this disclosure would appreciate that the functions of processor 102 could be performed by multiple processors or be replaced with discrete digital or analog circuitry. Processor 102 is powered at $V_+$ by a battery source such as batteries 198 and 199. In one embodiment, batteries 198 and 199 are AAA 1.5 volt batteries. A voltage divider comprising resistors 196 and 197 provides a voltage level to the processor at Analog to Digital Converter ("ADC") input ADC4. The processor 102 may continually monitor the voltage at ADC4 and should the voltage drop below a threshold operating value power the NCV detector 100 down and cause it to halt operation. Simultaneous to powering down, the NCV detector 100 may cause buzzer 160 to emit a plurality of signals, such as beeps, for example, for example, 3, prior to powering down the unit. Buzzer 160 could be any type of annunciator that provides a notification to a user of NCV detector 100, for example, a light, a beeper, a flasher, or any form of indication device.

In another embodiment, a flashlight (not shown) may be powered by the batteries 198 and 199, wherein the flashlight has a higher operating voltage than the processor 102. When the voltage detected by ADC4 drops below the operating voltage for the flashlight, the NCV detector 100 may cause the buzzer 160 to emit a plurality of beeps, for example, 3, and halt operation.

The circuitry comprising R1 105, C1 110, R2 115, C2 120, R3 125, Q1 130, and R4 may be used to generate one of two test signals input to probe 135. The above resistors and capacitors are sized such that a low voltage test signal or a high voltage test signal may be generated by placing the appropriate signals on O1, O2, and O3 of processor 102. O4 turns on transistor Q1 130 to enable the test signal to reach a probe 135. Those skilled in the art upon reading this disclosure would appreciate that other combinations of passive or active components or signal generators may be used to generate the test signal to Probe 135.

Probe 135 may be mounted on a fixed or a flexible printed circuit board ("PCB") 104 or may comprise traces on PCB 104. Those skilled in the art after reading this disclosure will appreciate that mounting the probe 135 on a PCB may reduce the chance that the leads to probe 135 may break. The remainder of the circuitry disclosed may be mounted on the same PCB 104 or may be mounted on a different board. The output of probe 135 is amplified by transistor 140 and sent to ADC1 input on processor 102.

During a probe integrity self-test, processor 102 may check to see whether an appropriate signal is received at ADC1 when Q1 130 is turned on and the self-test signal is being generated by the appropriate combination of O1, O2, and O3. If an open circuit is detected at ADC1 during self-test the buzzer 160 may emit a plurality of beeps, for example, 5, and power down the NCV detector 100.

NCV detector 100 may be instructed to power up in one of two modes: for example, a low voltage 12-48 volt range or a high voltage 50-1000 volt range. This can be accomplished a variety of ways through normally open power switch 145. Normally open power switch 145 may be pressed for a short time to start up in a high voltage mode or may be pressed for a longer time to start up in a low voltage mode. Those skilled in the art would appreciate that other systems could be put in place to control the mode of powering up NCV detector 100. For example, a first switch may be used to power on the NCV detector 100 and a second switch may be used to select the voltage range.

Buzzer 160 may be activated by output O5 turning on transistor Q5 150. An analog signal is detected at input ADC2. Upon turning on transistor Q5 150, voltage will be present across buzzer 160 (and its internal resistance), resistor R6 165, and transistor Q5 150. Should the buzzer 160 have an open circuit, no voltage will be detected at ADC2; should the buzzer 160 have a short circuit, the internal resistance of buzzer 160 will be absent and the voltage at ADC2 will be higher than expected of a working buzzer 160. Either condition will indicate a problem with buzzer 160. In operation the buzzer 160 may be activated by turning on Output O5 and sounded to indicate the presence of voltage at the probe 135.

One portion, for example, Green, of an operating LED, for example, Green/Yellow LED 185, may be turned on by output O7 of processor 102 turning on the base of transistor Q3 175. The other portion, for example, Yellow, of operating LED 185 may be turned on by output O8 of processor 102 turning on the base of transistor Q5 200. Green/Yellow LED 185 may be lit to indicate that self-tests have been passed. During testing mode O7 turns the base of Q3 175 on thus causing conduction from the collector to the emitter of Q3 175. Input ADC3 of processor 102 measures the voltage across R5 formed by the voltage divider of R7 195, voltage drop across the Green portion of Green/Yellow LED 185 and R5 155; should the Green portion of Green/Yellow LED be open, i.e., broken, voltage may not be present at ADC3 and the processor 102 will know that there is a problem with the Green/Yellow LED. Should the Green/Yellow LED be shorted, a different voltage than expected may be present at ADC3 and the processor 102 will know that there is a problem with the Green/Yellow LED 185. The Yellow portion of Green/Yellow LED 185 is tested in similar fashion, but uses Q5 200, and O8 output of processor 102. The voltage indicator LED, Red LED 180, operates in a similar fashion, but uses R8 190, Q4 170, and 06 output of processor 102. Voltage indicator Red LED may be turned on for a very short period of time, e.g., measured in milliseconds, such that an operator would not be able to observe the Red LED being lit. If either LED fails its test, the NCV detector 100 will emit a series of beeps, e.g., 5, and the NCV detector 100 will power down. In an exemplary embodiment, the Red LED 180 may be tested prior to testing the Green/Yellow LED 185.

Upon start up, continuously throughout operation, and/or periodically, one or more of the following tests may then be conducted in any particular order.

Figure 2:
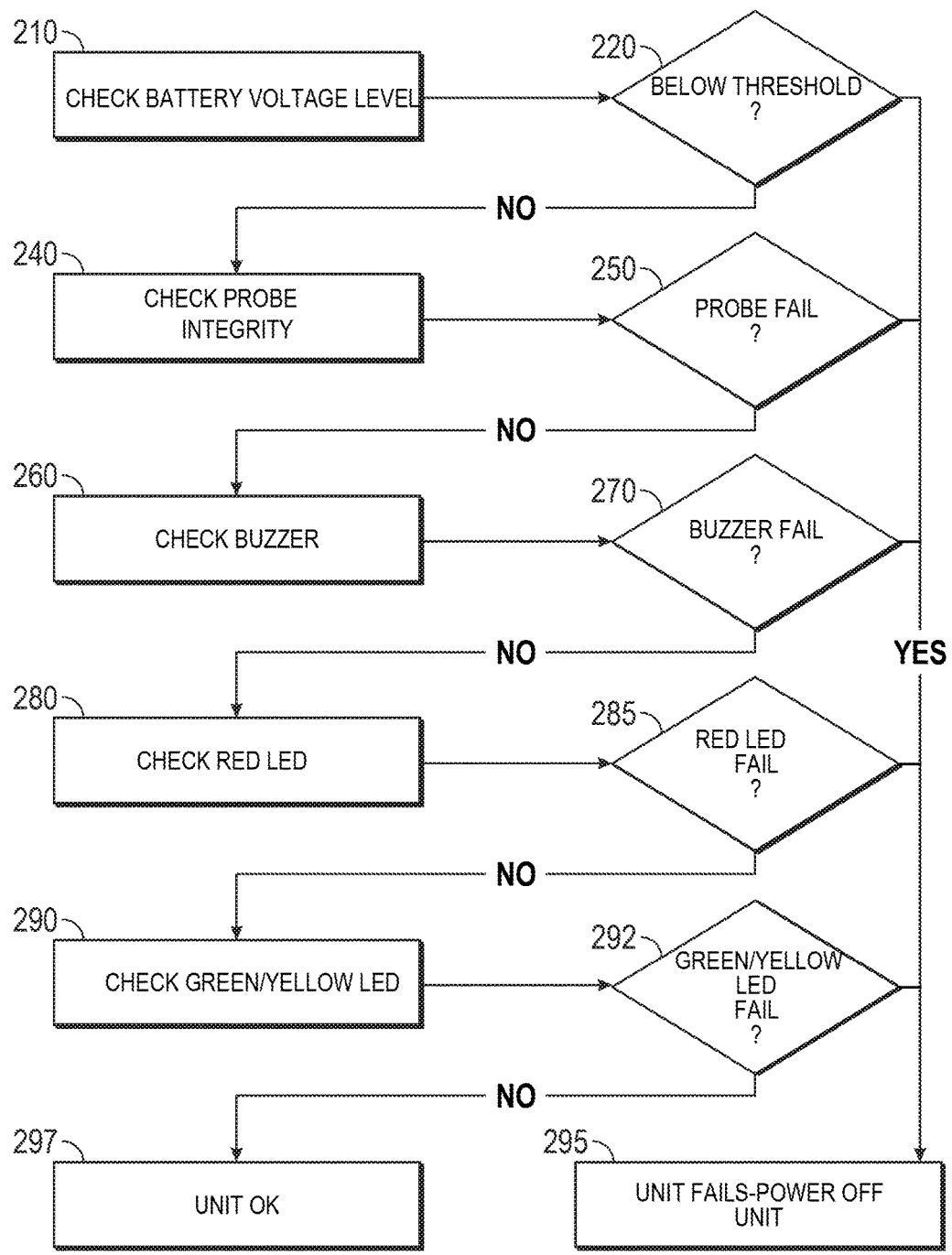
FIG. 2 is a flow chart of the self-test process of an exemplary NCV detector 100.

FIG. 2 is a flow chart of the self-test process of an exemplary NCV detector 100. The voltage at ADC4 may be measured to determine if batteries 198 and 199 are at proper voltage (stage 210). If the battery voltage is below a threshold level (stage 220), NCV detector 100 may emit a plurality of beeps, e.g., 3, and power down (stage 295).

Output O4 may be turned on thus turning on transistor Q1 and appropriate outputs from O1-O3 are activated to send a test signal to probe 135 (stage 240). The signal travels through the probe 135 and is received at ADC 1, where the processor 102 determines whether a signal has been received and determines the integrity of probe 135 (stage 250). Failure may result in the NCV detector 100 being powered off (stage 295).

Output O5 may be turned on to activate the buzzer 160 (stage 260). An input signal at ADC2 receives a voltage indicative of the status of the buzzer as previously described (stage 270). The NCV detector 100 may then power down if the buzzer fails the test (stage 295).

Output O6 may be turned on to active the voltage indicator Red LED (stage 280). Voltage indicator Red LED may be turned on for a very short period of time, e.g., measured in milliseconds, such that an operator would not be able to observe the Red LED. An input at ADC3 receives a voltage indicative of the status of the LED as previously described (stage 285). The NCV detector 100 may then power down if the Red LED fails the test (stage 295).

Output O7 may be turned on to activate the Green portion of operating Green/Yellow LED (stage 290). An input at ADC3 receives a voltage indicative of the status of the operating Green/Yellow LED as previously described (stage 292). Similarly, Output O8 may be turned on to activate the Yellow portion of operating Green/Yellow LED. Input ADC3 again receives a voltage indicative of the status of the Green/Yellow LED. The NCV detector 100 may then power down if the Green/Yellow LED fails the test (stage 295).

If all tests that are run result in a pass, the unit is OK and the Green/Yellow LED is powered on (stage 297).

In operation, upon power up, by pressing button 145 momentarily for high voltage mode or longer for low voltage mode, the self-test may be initiated prior to start up. Following a successful start-up in high voltage mode, Green/Yellow LED 185 may be illuminated by turning on output O7 to turn on the Green/Yellow LED 185 in the green color. Upon a successful start-up in low voltage mode Green/Yellow LED 185 is activated by turning on Output O8 and turned yellow. In operation the Red LED 180 may be activated by turning on Output O6 to indicate the presence of voltage at the probe 135. Those skilled in the art upon reading this disclosure would appreciate that other color combination or multiple indicators could be used in place of the Green/Yellow and Red combination described above. In an exemplary embodiment, the Green/Yellow LED 185 is not illuminated in any color should the NCV detector 100 fail the initial self-test or subsequent tests.

Embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to mechanical, optical, fluidic, and quantum technologies. In addition, embodiments of the disclosure may be practiced within a general purpose computer or in any other circuits or systems. Throughout the above discussion, reference has been made to transistors, those skilled in the art after reading this disclosure would appreciate that other active components, such as op-amps, could also be used.

Embodiments of the disclosure may be practiced via a system-on-a-chip (SOC) where each or many of the components illustrated in FIG. 1 may be integrated onto a single integrated circuit. Such an SOC device may include one or more processing units, graphics units, communications units, system virtualization units and various application functionality all of which may be integrated (or "burned") onto the chip substrate as a single integrated circuit. When operating via an SOC, the functionality described herein with respect to embodiments of the disclosure, may be performed via application-specific logic integrated with other components on the single integrated circuit (chip).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of conducting a self-test on a non-contact voltage detector with self-test function, comprising:
   receiving at a circuit a signal to power-on the non-contact voltage detector;
   testing integrity of a probe by injecting a signal into the probe and checking for receipt of the signal at an input of the circuit;
   testing integrity and functioning of an operating LED;
   testing integrity and functioning of a voltage indicator LED;
   lighting an operating LED when the probe passes its integrity test and the voltage indicator LED passes its integrity test, otherwise powering down the non-contact voltage detector; and
   testing integrity of a buzzer and wherein powering on the non-contact voltage detector further comprises powering on the non-contact voltage detector and lighting the operating LED when the buzzer passes its integrity test, otherwise powering down the non-contact voltage detector.

2. The method of claim 1, further comprising checking a battery level of the non-contact voltage detector and wherein powering on the non-contact voltage detector further comprises powering on the non-contact voltage detector and lighting the operating LED when the battery is at an operating level, otherwise powering down the non-contact voltage detector.

3. A non-contact voltage detector, comprising:
   a probe;
   a voltage indicator LED;
   an operating LED;
   a processor, in communication with the probe, the voltage indicator LED and the operating LED, the processor operable to:
      receive a signal to power-on the non-contact voltage detector;
      test integrity of the probe by injecting a signal into the probe and checking for receipt of the signal at an input of the processor;
      test integrity and functioning of the voltage indicator LED and the operating LED; and
      light the voltage indicator LED when the probe passes its integrity test and the voltage indicator LED passes its integrity test, otherwise power down the non-contact voltage detector;
   a battery in communication with the processor, the processor further operable to test a voltage level of the battery and power on the non-contact voltage detector and lighting the operating LED only when the voltage level of the battery is at an operating voltage, otherwise power down the non-contact voltage detector; and
   an analog to digital converter with an input in communication with a voltage divider providing a measure of battery voltage wherein the processor is operable to monitor the voltage at the analog to digital converter's input and power down the non-contact voltage detector when the voltage drops below a threshold operating value.

4. The non-contact voltage detector of claim 3, further comprising a buzzer in communication with the processor, the processor further operable to test integrity of the buzzer and power on the non-contact voltage detector and lighting the operating LED when the buzzer passes its integrity test, otherwise power down the non-contact voltage detector.

5. The non-contact voltage detector of claim 3, further comprising sounding a buzzer when the voltage drops below the threshold value.

6. The non-contact voltage detector of claim 3, wherein the probe is mounted on a flexible printed circuit board.

7. The non-contact voltage detector of claim 3, wherein the probe is mounted on a fixed printed circuit board.

8. The non-contact voltage detector of claim 3, further comprising an amplifier in communication with the probe to amplify a signal detected by the probe prior to the signal being received by the processor.

9. The non-contact voltage detector of claim 3, wherein the processor is operable to operate in a mode selected from the group consisting of a low voltage mode and a high voltage mode.

10. The non-contact voltage detector of claim 9, further comprising a power switch in communication with the processor, wherein the processor is operable to detect a short press indicative of a low voltage mode and a long press indicative of a high voltage mode.

11. The non-contact voltage detector of claim 9, further comprising a mode switch in communication with the processor operable to place the non-contact voltage detector in the low voltage mode or the high voltage mode.

12. The non-contact voltage detector of claim 11, wherein the buzzer is in communication with an output switch that is in communication with the processor, the output switch controlled by the processor.

13. The non-contact voltage detector of claim 12, further comprising a buzzer input line in communication with the buzzer and the output switch, wherein the input line is in communication with a buzzer input of the processor.

14. A device, comprising:
   a probe;
   a voltage indicator LED;
   an operating LED; and
   a processor, in communication with the probe, the voltage indicator LED and the operating LED, the processor operable to:
      test integrity of the probe by injecting a signal into the probe and checking for receipt of the signal at an input of the processor;
      test integrity and functioning of the voltage indicator LED; and
      light the voltage indicator LED when the probe passes its integrity test and the voltage indicator LED passes its integrity test, otherwise power down the non-contact voltage detector wherein the processor is operable to operate in a mode selected from the group consisting of a low voltage mode and a high voltage mode.

15. The device of claim 14, further comprising a buzzer in communication with the processor, the processor further operable to test the integrity of the buzzer and power on the non-contact voltage detector and lighting the operating LED only when the buzzer passes its integrity test, otherwise power down the non-contact voltage detector.

16. The device of claim 14, further comprising a battery in communication with the processor, the processor further operable to test a voltage level of the battery and power on the non-contact voltage detector and lighting the operating LED only when the voltage level of the battery is at an operating voltage, otherwise power down the non-contact voltage detector.

17. The device of claim 14, further comprising a power switch in communication with the processor, wherein the processor is operable to detect a short press indicative of a low voltage mode and a long press indicative of a high voltage mode.

18. The device of claim 14, further comprising a mode switch in communication with the processor operable to place the non-contact voltage detector in the low voltage mode or the high voltage mode.

19. The device of claim 18, wherein the buzzer is in communication with an output switch that is in communication with the processor, the output switch controlled by the processor.

20. The device of claim 19, further comprising a buzzer input line in communication with the buzzer and the output switch, wherein the input line is in communication with a buzzer input of the processor.

* * * * *